United States Patent [19]

Yamakido

[11] 4,338,656

[45] Jul. 6, 1982

[54] VOLTAGE POLARITY SWITCHING CIRCUIT

[75] Inventor: Kazuo Yamakido, Hachioji, Japan

[73] Assignee: Hitachi, Ltd., Tokyo, Japan

[21] Appl. No.: 165,334

[22] Filed: Jul. 2, 1980

[30] Foreign Application Priority Data

Jul. 20, 1979 [JP] Japan ................................. 54/91567

[51] Int. Cl.³ ............................................ H02M 3/06
[52] U.S. Cl. ...................................... 363/63; 307/127
[58] Field of Search ...................... 307/127, 138, 236; 361/245, 246; 363/59, 60, 63

[56] References Cited

U.S. PATENT DOCUMENTS 3,731,179   5/1973   Rademaker ...................... 363/63 X

*Primary Examiner*—A. D. Pellinen
*Attorney, Agent, or Firm*—Craig and Antonelli

[57] ABSTRACT

In a reference voltage generation circuit consisting of a capacitor, a reference voltage source for generating a predetermined voltage for charging the capacitor and a voltage polarity switching circuit for selectively inverting or not inverting the charged voltage of the capacitor to produce an output voltage at an output terminal, and capable of being fabricated in a semiconductor integrated circuit, the improvement wherein the voltage polarity switching circuit includes a second capacitor for compensating for an error between positive and negative reference voltages due to the stray capacitors.

2 Claims, 3 Drawing Figures

VOLTAGE POLARITY SWITCHING CIRCUIT

BACKGROUND OF THE INVENTION (1) Field of the Invention

This invention relates to a polarity switching circuit. More specifically, the present invention relates to a voltage polarity switching circuit, capable of selectively producing positive and negative output voltages whose absolute values are equal to each other, which circuit is suited for fabrication as a semiconductor integrated circuit.

(2) Description of the Prior Art

Positive and negative reference voltages or reference currents having absolute values which are equal to each other are required in a so-called A/D converter for converting analog electric signals of positive and negative polarities into digital codes, and such reference voltages or currents are required in a so-called D/A converter for making the reverse conversion. In order to fabricate the A/D or D/A converter in a small size and with a high accuracy by means of a semiconductor or monolithic IC, however, it is not advantageous from the aspects of both fabrication technique and fabrication economy to incorporate both positive and negative reference voltage sources in the converter. Accordingly, it is usually the practice to incorporate only either the positive or the negative reference voltage source and to combine it with a voltage polarity switching circuit for selectively changing over the polarity of the input voltage, which is the above-mentioned reference source, so as to obtain reference voltages of both positive and negative polarities.

However, since the conventional circuit construction of this kind is affected by the stray capacitance occurring in the integrated circuit, the absolute values of the two positive and negative voltages cannot be made equal to each other, as will be explained later in further detail. To approximate these two voltage values as closely as possible, the charging capacitor must have large electrostatic capacitance and a large area must be secured on a semiconductor substrate to form such a capacitor.

SUMMARY OF THE INVENTION

The present invention is therefore directed to provision of a voltage polarity switching circuit which eliminates the above-mentioned drawback of the conventional circuit, is capable of making the absolute values of the output voltages in both positive and negative directions equal to each other is capable of reducing the capacity of the required charging capacitor, and is thus suited for fabrication as an integrated circuit (IC).

To accomplish the above-mentioned object, the voltage polarity switching circuit in accordance with the present invention comprises a first capacitor, an input terminal for receiving an input voltage to charge said first capacitor, an output terminal for delivering an output voltage, a first switch interposed between one end of said first capacitor and said input terminal, a second switch interposed between the other end of said first capacitor and ground, a third switch interposed between one end of said first capacitor and said output terminal, a fourth switch interposed between one end of said first capacitor and ground, a fifth switch interposed between the other end of said first capacitor and said output terminal, a second capacitor having its one end connected to said output terminal and a sixth switch interposed between the other end of said second capacitor and ground, wherein after said first capacitor is charged by turning on said first, second, fifth and sixth switches with the other switches turned off, said second, third and sixth switches are turned on with the other switches turned off to produce an output voltage of a first polarity at said output terminal, and said fourth and fifth switches are turned on with the other switches turned off to produce an output voltage of a second polarity at said output terminal.

These and other objects and features of the present invention will be apparent from the following detailed description when read in connection with the accompanying drawings.

DESCRIPTION OF THE PREFERRED EMBODIMENT

Prior to the explanation of the present invention, an apparatus making practical application of a voltage polarity switching circuit and the conventional circuit construction thereof will be explained with reference to FIGS. 1 and 2.

Figure 1:
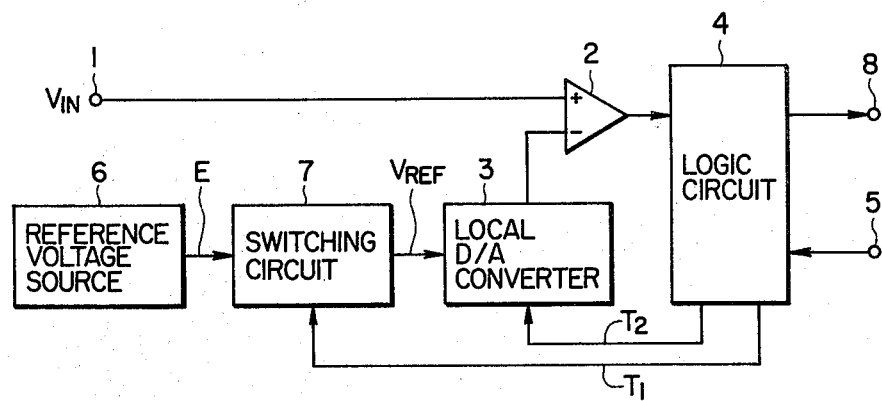
FIG. 1 is a prior art block diagram showing an example of an A/D converter as an application example of a voltage polarity switching circuit.

FIG. 1 shows diagrammatically the construction of a PCM encoder for converting telephone voice signals into digital codes, as an example of the apparatus which makes practical application of the polarity switching circuit.

In the drawing, analog input signals $V_{IN}$ to be encoded in digital code (voice signals in this case) are applied to a voltage comparator 2 through a terminal 1 and are compared with an output voltage from a local D/A converter 3. The result of this comparison is applied to a logic circuit 4. Reference numeral 6 identifies a temperature-stable voltage reference source consisting of a bandgap reference voltage source utilizing the temperature characteristic of the current density at the PN junction of a diode, for example, and reference numeral 7 identifies a polarity switching circuit which changes over the polarity of the output voltage E of the above-mentioned temperature-stable voltage reference source, suitably amplifies the output voltage E and supplies the local D/A converter with positive and negative reference voltages $V_{REF}$ having a value which is in conformity with the maximum value of the analog input signals $V_{IN}$.

The logic circuit 4 sequentially receives the output signals of the above-mentioned comparator 2 in synchronism with clock pulses provided from a terminal 5 and at the same time, produces output signals $T_1$, $T_2$, thereby controlling the polarity switching circuit 7 and the local D/A converter 3. For example, while the output voltage of the local D/A converter 3 is made zero at first, the logic circuit receives the output signal of the voltage comparator 2 to determine the polarity of the analog input signal $V_{IN}$ and produces a control signal $T_1$ in accordance with the result of that determination, thereby to bring the polarity of the output voltage $V_{REF}$ from the polarity switching circuit 7 into conformity with the polarity of the analog input signal $V_{IN}$. Thereafter, the logic circuit 4 produces the control signal $T_2$ while referring to the output of the voltage comparator 2 so as to sequentially change the network structure consisting of capacitors or resistance elements forming the local D/A converter and to produce at a terminal 8 a digital value corresponding to the state of the network structure as an A/D-converted value of the above-mentioned analog input signal $V_{IN}$ when the two input voltages of the voltage comparator 2 balance each other.

Figure 2:
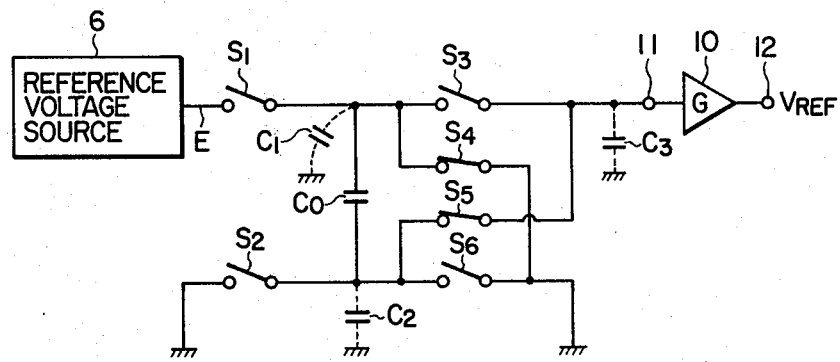
FIG. 2 is a circuit diagram of the heretofore known voltage polarity switching circuit.

As a reference voltage supply circuit including the above-mentioned voltage polarity switching circuit 7, there is known a circuit having the circuit construction of FIG. 2 such as disclosed in the Mar. 1, 1979, issue of the magazine "Electronics," at p. 108. This circuit consists of a reference voltage source 6, a charging capacitor $C_o$, six switching elements $S_1$–$S_6$ each consisting of an MOS transistor, for example, and an amplifier (voltage gain G) 10 with high input impedance. When each switching element is opened or closed under the control of an external control signal (such as the output $T_1$ of the logic circuit of FIG. 1), the circuit operates in three modes, i.e. the charging mode I of the capacitor $C_o$, the non-inverting voltage output mode II and the inverting voltage output mode III. The relationships between these three operation modes and the state of the switches $S_1$–$S_6$ are tabulated in Table 1.

TABLE 1

| Switch | Mode | | |
|---|---|---|---|
| | I | II | III |
| $S_1$ | ON | OFF | OFF |
| $S_2$ | ON | OFF | OFF |
| $S_3$ | OFF | ON | OFF |
| $S_4$ | OFF | OFF | ON |
| $S_5$ | ON | OFF | ON |
| $S_6$ | OFF | ON | OFF |

When the above-mentioned conventional circuit is fabricated, as an integrated circuit (IC), however, stray capacitance occurs between the respective ends of the capacitor $C_o$ and ground and between each node of the amplifier input terminal 11 and ground, as represented by $C_1$, $C_2$ and $C_3$ in FIG. 2. The stray capacitance causes a difference in the absolute values of the output voltages between the non-inverting voltage output mode II and the inverting voltage output mode III. When this circuit is adapted to an A/D or D/A converter, such as a PCM encoder or a PCM decoder, therefore, it causes the problem of second harmonic distortion in the signal conversion characteristics.

Namely, when the circuit is operated in the charging moe I, at first with the switches $S_1$, $S_2$ and $S_5$ kept on and the others kept off, not only the capacitor $C_o$ but also the stray capacitor $C_1$ are charged by the output voltage E of the voltage source 6. Since the stray capacitors $C_2$ and $C_3$ are grounded via the switches $S_2$ and $S_5$ at this time, the terminal 11 goes to ground potential and the output voltage $V_{REF}$ from the amplifier 10 becomes zero Volt.

Next, when the non-inverting voltage output mode II is selected with the switches $S_3$ and $S_6$ on and the others off, a part of the charges of capacitors $C_o$ and $C_1$ moves to the stray capacitor $C_3$ so that the output voltage $V_{REF(+)}$ of the amplifier 10 is represented by the following equation (1);

$$V_{REF(+)} = G \cdot \frac{C_0 + C_1}{C_0 + C_1 + C_3} \cdot E \quad (1)$$

On the other hand, when the inverting voltage output mode III is directly selected from the above-mentioned charging mode I, the switches $S_4$ and $S_5$ are turned on with the others off whereby the charge of the capacitor $C_o$ moves to the stray capacitors $C_2$ and $C_3$ and the charge of the stray capacitor $C_1$ is discharged to ground. Accordingly, the output voltage $V_{REF(-)}$ at this time has a different absolute value from the non-inverting output voltage $V_{REF(+)}$ as represented by the following equation (2);

$$V_{REF(-)} = -G \cdot \frac{C_0}{C_0 + C_2 + C_3} \cdot E \quad (2)$$

If the output of the above-mentioned circuit is as such applied to the reference voltage of the A/D (or D/A) converter, therefore, a second harmonic distortion occurs in the conversion characteristics. The distortion ratio x in this instance is given by the following equation according to the prior art reference (IEEE Trans. on Circuit and Systems, Vol. CAS-25, No. 7, July 1978, p. 427);

$$x = 20 \log_{10} \frac{2}{3\pi} \cdot \alpha \quad (3)$$

where $$\alpha = \frac{V_{REF(+)} - |V_{REF(-)}|}{|V_{REF(-)}|} \quad (4)$$

If it is desired to keep the second harmonic distortion ratio x not smaller than 55 dB, about the value required by a voice-PCM encoder, it is necessary that $\alpha \leq 0.008$. In the case of the conventional circuit, $\alpha$ is given as follows from the equations (1), (2) and (4)

$$\alpha \approx \frac{C_2}{C_0} + \frac{C_3}{C_2}(C_1 - C_2)$$

If $C_1 = C_2 = 0.5$ PF and $C_3 = 1.5$ PF by way of example, the charging capacitor $C_o$ must satisfy the relation $C_o \geq 62.5$ PF in order to realize the above-mentioned distortion ratio. The capacitor having such a value requires an extremely large chip area when the voltage inversion amplification circuit is constructed by means of a semiconductor IC or monolithic IC, and this markedly deteriorates the economy of the circuit device.

Figure 3:
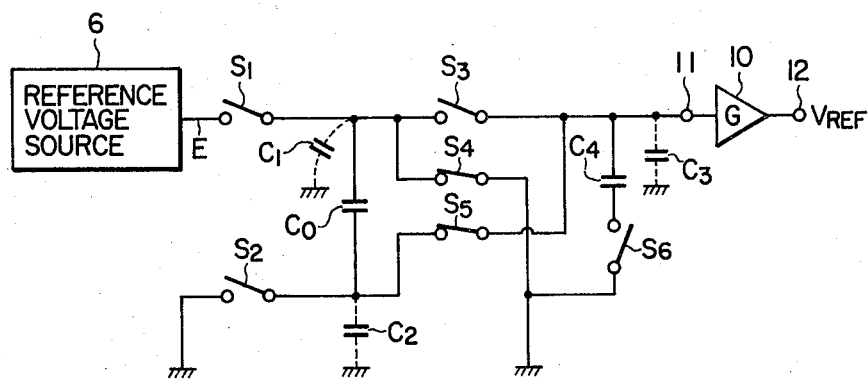
FIG. 3 is a circuit diagram of an example of the voltage polarity switching circuit in accordance with the present invention.

As shown in FIG. 3, the polarity switching circuit in accordance with the present invention, which solves the above-mentioned problem encountered in the prior art, includes a charging capacitor $C_o$, six switching elements $S_1$–$S_6$ and a capacitor $C_4$ for compensating for the stray capacitors. This circuit is characterized in that one end of the above-mentioned capacitor $C_4$ is connected to an output terminal 11 (input terminal of an amplification circuit 10) with the other grounded via the switch $S_6$. In this arrangement, the charging mode I, the non-inverting voltage output mode II and the inverting voltage output mode III are carried out in accordance with the opening and closing actions of the switches tabulated in Table 2.

TABLE 2

| Switch | Mode | | |
|---|---|---|---|
| | I | II | III |
| $S_1$ | ON | OFF | OFF |
| $S_2$ | ON | ON | OFF |
| $S_3$ | OFF | ON | OFF |
| $S_4$ | OFF | OFF | ON |
| $S_5$ | ON | OFF | ON |
| $S_6$ | ON | ON | OFF |

In the circuit shown in FIG. 3, $C_1$–$C_3$ represent the stray capacitors added to each node in the same way as in the circuit of FIG. 2.

Next, the operation of the circuit of the present invention will be explained. Initially, in the charging mode I, the switches $S_1$, $S_2$, $S_5$ and $S_6$ are turned on with the others turned off and the output voltage E of the voltage source 6 charges the capacitor $C_o$. Thus, the stray capacity $C_1$. At this time, the charges on capacitors $C_2$, $C_3$ and $C_4$ are all discharged and the output voltage at the terminals 11 and 12 is zero volt.

In the non-inverting voltage output mode II, the switches $S_2$, $S_3$ and $S_6$ are turned on with the others being turned off. At his time, since the charges on capacitors $C_1$ and $C_o$ move to $C_3$ and $C_4$, the output voltage $V_{REF(+)}$ from the terminal 12 becomes a value expressed by the following equation (5);

$$V_{REF(+)} = G \cdot \frac{C_0 + C_1}{C_0 + C_1 + C_3 + C_4} \cdot E \quad (5)$$

In the inverting voltage output mode III, on the other hand, the switches $S_4$ and $S_5$ are turned on with the others off and the charge of the capacitor $C_o$ moves to the capacitors $C_2$ and $C_3$ so that the output $V_{REF(-)}$ from the terminal 12 is given by;

$$V_{REF(-)} = -G \cdot \frac{C_0}{C_0 + C_2 + C_3} \cdot E \quad (6)$$

When the equations (5) and (6) are substituted for the equation (4), the value $\alpha$ in the circuit of the present invention is expressed by the following equation (7), assuming $C_o > C_1 \sim C_4$;

$$\alpha = \frac{1}{C_0}\left( C_2 + \frac{C_1}{C_0}(C_2 + C_3) - C_4 \right)$$

$$\times \left\{ 1 - \frac{1}{C_0}(C_1 + C_3 + C_4) + \frac{1}{C_0^2}(C_1 + C_3 + C_4)^2 \right\} \quad (7)$$

The second item of the equation (7) always has a positive value with respect to optional values of $C_o$, $C_1$, $C_3$ and $C_4$. But in the first item, if the values of $C_o$ and $C_4$ are so set between $C_o$, $C_1$, $C_2$, $C_3$ and $C_4$ as to satisfy the relation $$C_4 = C_2 + \frac{C_1}{C_0}(C_2 + C_3) \quad (8)$$

it is possible to make $\alpha$ zero ($\alpha = 0$).

When, for example, the values of the stray capacitors are $C_1 = C_2 = 0.5$ PF and $C_3 = 1.5$ PF, $\alpha = 0$ can be attained by making $C_4 = 0.7$ PF if the capacitor $C_o = 5$ PF.

As can be seen from the numeric example, the values of the capacitors $C_o$ and $C_4$ to be used in the circuit of the present invention are extremely small so that these elements can be incorporated in an IC having a small chip size. In accordance with the present invention, further, it is theoretically possible to obtain reference voltages having equal absolute values in both positive and negative directions. For this reason, even if there is considerable variance in the values of $C_o$ and $C_4$ from the design values due to errors during the IC fabrication, the circuit of the present invention provides non-inverting and inverting voltages having by far a higher accuracy when compared with the conventional circuit.

Accordingly, the polarity switching circuit of the present invention per se is suited for the circuit integration (IC). When the present circuit is combined with a reference voltage source and an amplifier, a reference voltage having an optional value both in positive and negative directions can be produced. Thus, the voltage polarity switching circuit of the present invention is very useful for providing an A/D converter or D/A converter having a high level of accuracy as required especially in the field of PCM communication in a remarkably reduced size and in an economical manner.

What is claimed is:

1. A voltage polarity switching circuit comprising a first capacitor, an input terminal for receiving an input voltage to charge said first capacitor, an output terminal for delivering an output voltage, a first switch interposed between one end of said first capacitor and said input terminal, a second switch interposed between the other end of said first capacitor and ground and a switching circuit fo selectively inverting the voltage charge on said first capacitor and providing it to said output terminal, characterized in that said switching circuit comprises a third switch interposed between said one end of said first capacitor and said output terminal, a fourth switch interposed between said one end of said first capacitor and ground, a fifth switch interposed between the said other end of said first capacitor and said output terminal, a second capacitor having its one end connected to said output terminal and a sixth switch interposed between the other end of said second capacitor and ground, and means for controlling said switches including means for charging said first capacitor by turning on said first, second, fifth and sixth switches with the other switches turned off, means for turning on said second, third and sixth switches with the other switches turned off thereby to produce an output voltage of a first polarity at said output terminal, and means for turning on said fourth and fifth switches with the other switches turned off thereby to produce an output voltage of a second polarity at said output terminal.

2. A voltage polarity switching circuit according to claim 1, wherein the capacitance $C_o$ of said first capacitor and the capacitance $C_4$ of said second capacitor substantially satisfy the following relation $$C_4 = C_2 + \frac{C_1}{C_0}(C_2 + C_3)$$

where $C_1$, $C_2$ and $C_3$ represent the stray capacitors occurring between one end of said first capacitor and ground, between the other end of said first capacitor and ground and between said output terminal and ground, respectively.

* * * * *